United States Patent
Burns et al.

(10) Patent No.: US 9,648,736 B2
(45) Date of Patent: May 9, 2017

(54) CIRCUIT BOARD, PARTICULARLY FOR A POWER-ELECTRONIC MODULE, COMPRISING AN ELECTRICALLY-CONDUCTIVE SUBSTRATE

(71) Applicant: A.B. Mikroelektronik Gesellschaft mit beschraenkter Haftung, Salzburg (AT)

(72) Inventors: Robert Christopher Burns, Salzburg (AT); Wolfgang Tusler, Salzburg (AT); Bernd Haegele, Engelsberg (DE)

(73) Assignee: A.B. MIKROELEKTRONIK GESELLSCHAFT MIT BESCHRAENKTER HAFTUNG, Salzburg (AT)

( * ) Notice: Subject to any disclaimer, the term of this patent is extended or adjusted under 35 U.S.C. 154(b) by 6 days.

(21) Appl. No.: 14/528,346

(22) Filed: Oct. 30, 2014

(65) Prior Publication Data
US 2015/0055306 A1      Feb. 26, 2015

Related U.S. Application Data

(63) Continuation of application No. PCT/AT2013/000063, filed on Apr. 15, 2013.

(30) Foreign Application Priority Data

May 4, 2012   (AT) .................................. A 526/2012

(51) Int. Cl.
*H05K 7/00*   (2006.01)
*H05K 1/05*   (2006.01)
(Continued)

(52) U.S. Cl.
CPC ........... *H05K 1/053* (2013.01); *H01L 23/492* (2013.01); *H01L 25/072* (2013.01); *H02M 7/003* (2013.01);
(Continued)

(58) Field of Classification Search
USPC .................................. 361/760, 739; 174/255
See application file for complete search history.

(56) References Cited

U.S. PATENT DOCUMENTS

| | | |
|---|---|---|
| 4,993,148 A | 2/1991 | Adachi et al. |
| 5,081,562 A | 1/1992 | Adachi et al. |

(Continued)

FOREIGN PATENT DOCUMENTS

| | | |
|---|---|---|
| CN | 101309874 | 11/2008 |
| CN | 101593707 | 12/2009 |

(Continued)

OTHER PUBLICATIONS

International Search Report (ISR) issued Sep. 19, 2013 in International (PCT) Application No. PCT/AT2013/000063.

(Continued)

*Primary Examiner* — Andargie M Aychillhum
(74) *Attorney, Agent, or Firm* — Wenderoth, Lind & Ponack, L.L.P.

(57) ABSTRACT

The invention relates to a circuit board, particularly for a power-electronic module, comprising an electrically-conductive substrate which consists, at least partially and preferably entirely, of aluminium and/or an aluminium alloy. On at least one surface of the electrically-conductive substrate, at least one conductor surface is arranged in the form of an electrically-conductive layer applied preferably using a printing method and more preferably using a screen-printing method, said conductor surface being in direct electrical contact with the electrically-conductive substrate.

2 Claims, 7 Drawing Sheets

(51) Int. Cl.
*H01L 23/492* (2006.01)
*H01L 25/07* (2006.01)
*H05K 1/02* (2006.01)
*H02M 7/00* (2006.01)
*H05K 7/02* (2006.01)
*H05K 7/04* (2006.01)
*H01L 25/18* (2006.01)

(52) U.S. Cl.
CPC ........... *H05K 1/021* (2013.01); *H05K 1/0263* (2013.01); *H05K 7/023* (2013.01); *H05K 7/04* (2013.01); *H01L 25/18* (2013.01); *H01L 2924/0002* (2013.01); *H05K 1/056* (2013.01); *H05K 2201/10166* (2013.01)

(56) References Cited

U.S. PATENT DOCUMENTS

| | | | |
|---|---|---|---|
| 5,173,844 | A | 12/1992 | Adachi et al. |
| 6,184,579 | B1 | 2/2001 | Sasov |
| 8,058,781 | B2 | 11/2011 | Lee et al. |
| 8,400,788 | B2 | 3/2013 | Hansson |
| 9,126,832 | B2 | 9/2015 | Hansson |
| 2001/0030362 | A1 | 10/2001 | Grant |
| 2005/0277550 | A1 | 12/2005 | Brown et al. |
| 2006/0160330 | A1 | 7/2006 | Kobayashi et al. |
| 2007/0108423 | A1 | 5/2007 | Brown et al. |
| 2007/0114665 | A1* | 5/2007 | Bayerer ............ H01L 24/24 257/747 |
| 2007/0217221 | A1* | 9/2007 | Lee ............ H05K 1/021 362/612 |
| 2008/0303161 | A1 | 12/2008 | Kobayashi et al. |
| 2008/0318061 | A1 | 12/2008 | Inaba et al. |
| 2009/0004369 | A1* | 1/2009 | Inaba ............ C03C 3/064 427/99.2 |
| 2010/0101936 | A1 | 4/2010 | Hansson |
| 2010/0155117 | A1 | 6/2010 | Inaba et al. |
| 2011/0114898 | A1 | 5/2011 | Inaba et al. |
| 2013/0168230 | A1 | 7/2013 | Hansson |
| 2013/0169397 | A1 | 7/2013 | Hansson |

FOREIGN PATENT DOCUMENTS

| | | |
|---|---|---|
| CN | 201657572 | 11/2010 |
| CN | 201986264 | 9/2011 |
| DE | 101 01 086 | 7/2001 |
| JP | 60-187087 | 9/1985 |
| JP | 1-112793 | 5/1989 |
| JP | 4-14852 | 1/1992 |
| JP | 4-164384 | 6/1992 |
| JP | 6-37421 | 2/1994 |
| JP | 2000-58717 | 2/2000 |
| JP | 2004-140068 | 5/2004 |
| JP | 2004-319562 | 11/2004 |
| JP | 2006-49542 | 2/2006 |
| JP | 2007-251176 | 9/2007 |
| JP | 2008-270528 | 11/2008 |
| JP | 2010-531044 | 9/2010 |
| RU | 2190284 | 9/2002 |
| RU | 2009 127 518 | 1/2011 |
| TW | 2008 35409 | 8/2008 |

OTHER PUBLICATIONS

Austrian Patent Office Search (ASR) Report issued Mar. 11, 2013 in Austrian Patent Application No. A 526/2012.

Japanese Office Action (OA) issued May 24, 2016 in related Japanese Patent Application No. 2015-509254, together with English translation thereof.

* cited by examiner

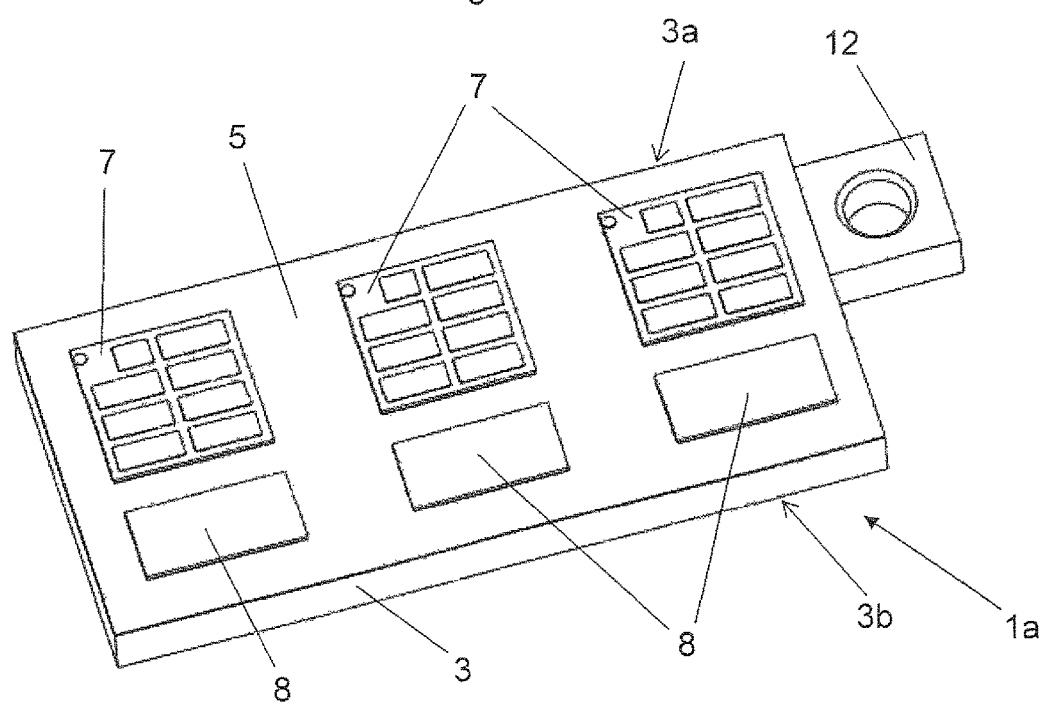

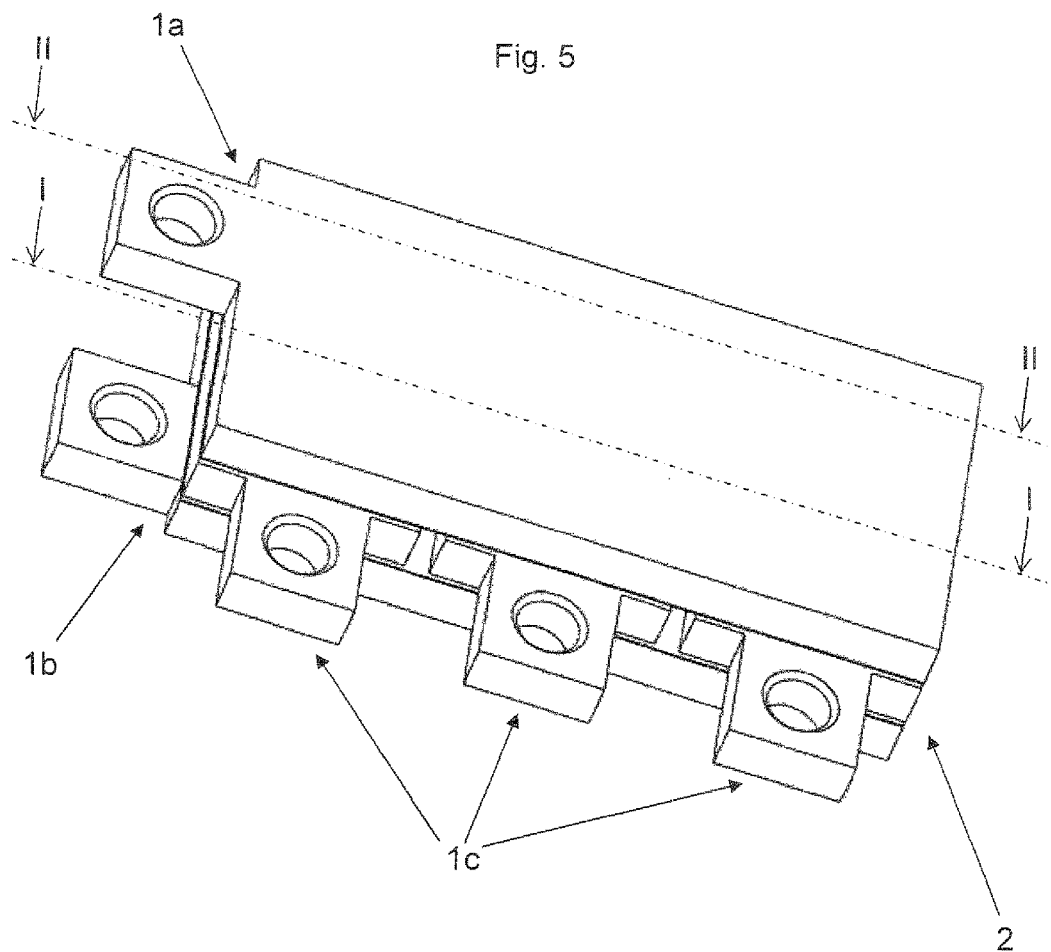
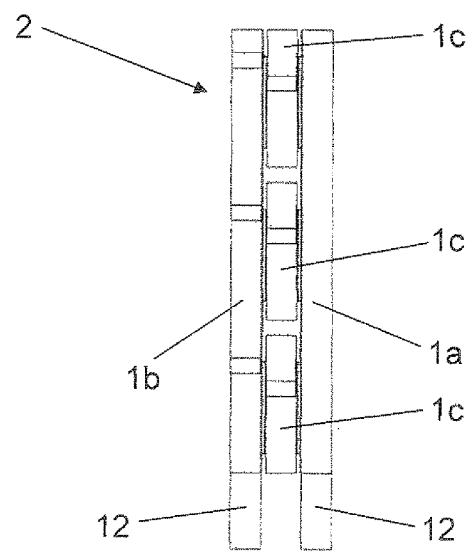

CIRCUIT BOARD, PARTICULARLY FOR A POWER-ELECTRONIC MODULE, COMPRISING AN ELECTRICALLY-CONDUCTIVE SUBSTRATE

BACKGROUND OF THE INVENTION

Field of the Invention

The invention concerns a printed circuit board, in particular for a power electronic module, comprising an electrically conductive substrate, wherein the substrate at least partially and preferably completely comprises aluminum and/or an aluminum alloy. The invention further concerns a power electronic module including at least one printed circuit board and a method of producing a printed circuit board.

Background of Related Art

The material aluminum is of ever increasing significance in particular in the field of power electronics. Due to its comparatively low weight and the low costs aluminum is frequently used as a cooling body for electronic components (for example LEDs, IGBTs or MOSFETs) in power electronic modules or directly as current-carrying conductors, in particular as a current or bus bar. For those purposes of use aluminum has a very high level of thermal conductivity and also a very high level of electrical conductivity.

In the field of power electronics an insulated metal substrate (referred to for brevity as IMS) is frequently used as the substrate, which includes a core of aluminum and which is encased by an electrically insulating or dielectric layer. In that case the aluminum core is used exclusively for improved heat conduction. The conductor tracks themselves are arranged on the insulating layer and are not electrically contacted with the aluminum core.

SUMMARY OF THE INVENTION

The object of the invention is to provide a printed circuit board of the general kind set forth, on which electronic components can be arranged to be electrically contactable with a substrate of the printed circuit board. In particular the invention seeks to provide that an electronic component can be soldered to a substrate of a printed circuit board, that predominantly comprises aluminum and/or aluminum alloy, in order to be able to make electrical contacting of the electronic component with the substrate.

According to the invention that object is attained by the features of claim 1. Advantageous configurations of the invention are recited in the appendant claims.

According to the invention it is therefore provided that arranged on at least one surface of the electrically conductive substrate is at least one conductor surface in the form of an electrically conductive layer applied preferably by a printing process and particularly preferably by a screen printing process, wherein the conductor surface is directly electrically contacted with the electrically conductive substrate.

An aim of the invention is to achieve direct electrical contacting of conductor tracks or conductor surfaces arranged on the substrate with the substrate itself and to use the substrate as an electrical conductor. In the case of the proposed printed circuit board an electrically conductive conductor surface which can substantially comprise copper and which can be of a thickness of between 25 µm and 125 µm, preferably between 90 µm and 110 µm, is arranged directly on a surface of the electrically conductive substrate. It is therefore possible to dispense with an insulating layer arranged between the substrate and the conductor surface. That makes it possible on the one hand to achieve a simplified structure for the printed circuit board, whereby a printed circuit board can also be produced at lower cost. On the other hand in that way the substrate, in addition to its function as a heat-dissipating device, can also be used as the current-carrying part of the printed circuit board. That is advantageous in particular in relation to power electronic modules and the high electrical currents occurring therein.

According to a particularly preferred embodiment it can be provided that the at least one surface of the electrically conductive substrate is substantially flat. That makes it possible to substantially simplify the process for producing a printed circuit board. Thus for example conventional aluminum plates of a thickness of between about 1 mm and 3 mm can be easily cut, sawn or stamped out, according to the respective requirements, without the surfaces of the aluminum plates having to be specially treated.

In a preferred embodiment of the invention it can be provided that arranged on the at least one surface of the electrically conductive substrate is at least one insulator surface in the form of a dielectric layer preferably applied by a printing process and particularly preferably by a screen printing process. In that respect the at least one insulator surface can at least partially adjoin the at least one conductor surface, and can preferably surround the at least one conductor surface.

To prevent flash-over between current- or voltage-carrying parts and a related short-circuit they must be arranged at a given spacing relative to each other. For example the spacing or the air gap between two voltage-carrying parts with a voltage difference of 400 V should be at least 4 mm in accordance with the Standard DIN EN 60664-1 VDE 0110-1. By virtue of the insulator surface the spacing relative to other current-carrying parts, for example other printed circuit boards within a power electronic module, with the same dielectric strength, can be reduced, for example to below 1 mm.

In that way it is possible to reduce structural sizes of power electronic modules which include at least one proposed printed circuit board.

The thickness of the insulator surface can be selected in accordance with the respective flash-over voltage to be rated. In the case of an average flash-over voltage of the dielectric layer of 800 V per 25 µm a thickness of 100 µm for the insulator surface is usually sufficient. In general the thickness of the dielectric layer can be selected in dependence on the flash-over voltage of an IGBT used and arranged for example between two printed circuit boards and for example can be so selected for high-voltage applications that a flash-over voltage of between about 600 V and about 1700 V is achieved.

In general the insulator surface can also serve as a solder covering for the at least one conductor surface. Therefore the at least one insulator surface can be applied to the substrate in such a pattern so that the at least one conductor surface or a plurality of conductor surfaces are surrounded or enclosed by the insulator surface.

To produce the at least one insulator surface on the substrate it can be provided that a dielectric layer is applied at least region-wise to the at least one surface of the substrate. In that case a dielectric thick-layer paste can be applied by a printing process, preferably by a screen printing process. The thick-layer paste can be dried at temperatures below about 200° C. for about 10 min or sintered directly in a firing furnace.

Firing or sintering of the thick-layer paste can be effected in an air atmosphere at temperatures of between about 540° C. and about 640° C. in a firing furnace. It is also possible for the thick-layer paste to be fired at temperatures below 540° C. but that can have a detrimental effect on adhesion of the thick-layer paste to the substrate. When the thick-layer paste is fired at over 640° C. the substrate can begin to soften as the melting point of aluminum is at about 660° C.

To achieve advantageous adhesion of the thick-layer paste to the substrate glass constituents of the thick-layer paste can include at least one alkali metal oxide, for example lithium oxide, sodium oxide or potassium oxide. As a result the glass constituents already melt at temperatures below the melting point of aluminum. In addition, the coefficient of expansion of the thick-layer paste can be increased and/or or adapted to the coefficient of expansion of aluminum, by the presence of alkali metal oxides.

A proposed printed circuit board is particularly suitable for being used in compact power electronic modules, for example in high-current multi-phase power bridges or inverters. Such power electronic modules frequently employ electronic switches or transistors in the form of bipolar transistors with insulated gate electrodes (referred as "insulated-gate bipolar transistors" or for brevity IGBT). For the connection of such a gate electrode it can be provided that at least one connecting surface in the form of an electrically conductive layer is disposed on the at least one insulator surface.

The connecting surface can be subsequently connected to the gate terminal of an IGBT, for example by soldering.

Protection is also claimed for a power electronic module as set forth in claim 12. Advantageous configurations are recited in the claims appended thereto.

A proposed printed circuit board can be part of a power electronic module, for example of an inverter. Such inverters are used inter alia in hybrid or fully electric drive trains in the automobile sector in order to convert the dc voltage of a dc voltage source (for example a battery) into a 3-phase ac voltage for a three-phase motor. The inverter itself can in that case include six electronic switches (for example IGBTs) and free-wheeling diodes corresponding thereto. In that case, by suitable actuation of the gate terminals of the IGBTs a dc voltage connected to the inverter, for example in the range of between about 300 V and 1200 V, can be converted in known manner into three phase-displaced ac voltages and fed to a three-phase motor.

According to a particularly preferred embodiment a proposed power electronic module can include a first printed circuit board, a second printed circuit board and three third printed circuit boards.

For the first printed circuit board it can be provided that a plurality of conductor surfaces, preferably six conductor surfaces, are arranged on the at least one surface of the electrically conductive substrate, wherein preferably the conductor surfaces are surrounded by an insulator surface. For example three IGBTs and three free-wheeling diodes corresponding thereto can be mounted to the conductor surfaces, for example by soldering. The first printed circuit board can be for example in the form of a negatively poled current bar of an inverter, that can be connected to the negative pole of a dc voltage source.

For the second printed circuit board it can additionally be provided that a plurality of connecting surfaces, preferably three connecting surfaces, are arranged on the insulator surface. In that way, in addition to mounting three IGBTs and three free-wheeling diodes corresponding thereto to the conductor surfaces, the gate electrodes of the IGBTs can also be connected to the connecting surfaces, for example by soldering, and subsequently actuated. The second printed circuit board can be for example in the form of a positively poled current bar of an inverter, that can be connected to the positive pole of a dc voltage source.

For each of the three third printed circuit boards it can be provided that a plurality of conductor surfaces, preferably two conductor surfaces, are arranged on a first surface of the electrically conductive substrate, and a plurality of conductor surfaces, preferably two conductor surfaces, and at least one insulator surface, are arranged on a second surface of the electrically conductive substrate, wherein a connecting surface is arranged on the at least one insulator surface.

Each of the three third printed circuit boards can in that case be in the form of a phase connection of an inverter for a three-phase motor. The two conductor surfaces of the first surface of a third printed circuit board can in that case be connected, by example by soldering, to a respective pair of electronic components—including an IGBT and a free-wheeling diode corresponding thereto—which can be arranged on the second printed circuit board. In that case the two conductor surfaces and the connecting surface of the second surface of a third printed circuit board can be connected, for example by soldering, to a respective pair of electronic components—including an IGBT and a free-wheeling diode corresponding thereto—which can be arranged on the first printed circuit board. The connecting surface can serve in that case for respectively connecting the gate electrode of an IGBT.

It has proven to be particularly advantageous if the printed circuit boards are arranged substantially stacked, wherein three third printed circuit boards are arranged, preferably in mutually juxtaposed relationship, between the first printed circuit board and the second printed circuit board. That makes it possible to provide that a power electronic module is of a very compact structure.

In a particularly preferred embodiment it can be provided that the power electronic module is in the form of a high-current multi-phase power bridge, wherein three transistors, preferably IGBTs and three free-wheeling diodes are mounted, preferably soldered, on the at least one surface of the first printed circuit board and/or the second surfaces of the three third printed circuit boards, and wherein three transistors, preferably IGBTs and three free-wheeling diodes are mounted, preferably soldered, on the at least one surface of the second printed circuit board and/or the first surfaces of the three third printed circuit boards.

The operation of soldering electronic components like for example IGBTs and free-wheeling diodes on a proposed printed circuit board can preferably be effected by vapor phase soldering. In that way a unitary temperature gradient can be achieved in the solder layers of a power electronic module. In the case of a stacked inverter a first solder layer can be arranged between the first printed circuit board and the three third printed circuit boards and a second solder layer can be arranged between the three third printed circuit boards and the second printed circuit board.

In general a conductor surface can be applied to the surface of a substrate by various processes like for example by galvanic processes, plasma metal sprays or by plating (for example roll plating).

Protection is also claimed for a method of producing a printed circuit board as set forth in claim 16.

A chemical property of aluminum is a thin oxide layer which is very quickly formed in the air and which is formed by contact with oxygen in the atmosphere as a consequence of an oxidation process at the surface of an aluminum body.

That oxide layer admittedly affords on the one hand protection from corrosion, but on the other hand it causes difficulties in joining aluminum to other materials by soldering, welding or other known joining techniques.

For producing a proposed printed circuit board, in particular for producing the at least one conductor surface on the substrate, it can therefore be provided that a conductor paste is applied at least region-wise to a surface of the substrate, in a first firing phase the conductor paste is exposed to a substantially continuously rising firing temperature, wherein the firing temperature is increased to a predeterminable maximum firing temperature of less than about 660° C., in a second firing phase the conductor paste is exposed substantially to the predeterminable maximum firing temperature for a predeterminable period of time, in a cooling phase the conductor paste is cooled down and in a post-treatment phase a surface of the conductor paste is mechanically post-treated, preferably brushed.

The regions at which the conductor paste is applied and sintered in accordance with the method steps provide for electrical contacting of the substrate instead of the oxidized surface of the substrate, that prevails in that region. That electrically conductive layer which is achieved at least region-wise by the application and sintering of the conductor paste can be subsequently used for example for soldering an electronic component or also for soldering a cooling body, wherein the cooling body itself can in turn comprise aluminum.

In that case the substrate can at least partially and preferably completely comprise an aluminum material with a proportion of aluminum that is as high as possible. Preferably an aluminum material is used, of the quality EN AW-1050A or EN AW-1060A in accordance with European Standard EN 573, containing at least 99.5% by weight or 99.6% by weight respectively. In spite of somewhat lower liquidus temperatures and a lower level of thermal conductivity in comparison with the above-mentioned substantially pure aluminum materials it is also possible to use aluminum alloys, for example aluminum alloys including manganese or magnesium like for example EN AW-3003 (AlMn1Cu), EN AW-3103 (AlMn1), EN AW-5005 (AlMg1) or EN AW-5754 (AlMg3).

The described production method gives the possible option of selectively metallizing individual regions of the surface of an aluminum-based substrate, wherein the metallized regions are directly connected in the form of sintered conductor paste to the substrate in bonded joining of the materials involved and that makes it possible to achieve a high level of electrical conductivity and a high level of thermal conductivity of conductor paste to substrate and vice-versa. In addition the metallized regions represent solderable regions by which the substrate can be connected to further components in known fashion. Thus for example individual electronic components can be soldered on to the metallized regions using conventional soldering agents like eutectic Sn—Pb-, Sn—Ag—Cu- or Sn—Au-solders.

According to a particularly preferred embodiment it can be provided that the conductor paste is applied to the surface of the substrate by a printing process, preferably by a screen printing process.

In that case conventional conductor pastes in the form of thick-layer pastes or sinter pastes can be used. Different degrees of heat expansion of conductor paste and substrate can be compensated by the porosity of thick-layer pastes, whereby the reliability of the connection between the conductor paste and the substrate can be increased, in particular in relation to major cyclic thermal stresses as for example in the automobile field.

The additive nature of the screen printing procedure with which layers are built up on a substrate means it is also possible, for metallizing a substrate surface, to dispense with the use of exposure and etching processes, which leads to cost advantages for the proposed process.

A thick-layer conductor paste usually includes at least a metal powder as an electrically conductive agent, an inorganic powder (for example glass frits) as bonding agent, as well organic binding and dissolving agents. The organic binding and dissolving agents lead to a paste-like consistency with given rheological properties, which however are also influenced by the further constituents of the conductor paste.

In regard to the constituent of the electrically conductive metal powder it can preferably be provided that a conductor paste including a copper powder is used. It will be appreciated however that it is also possible to use a conductor paste including a silver and/or gold powder. The use of copper powder is however markedly less expensive in that respect.

In regard to the constituent of the inorganic powder it can preferably be provided that a conductor paste including a glass from the $PbO$—$B_2O_3$—$SiO_2$ system and/or a glass including $Bi_2O_3$ is used. In that way, during the sintering procedure in the proposed method, in spite of the comparatively low firing temperatures prevailing in that situation, it is possible to achieve very good adhesion of the conductor paste to the substrate.

After a conductor paste is applied by printing, for example by a screen printing process known in the state of the art, the conductor paste remains substantially on the corresponding regions by virtue of its rheological properties, without flowing to any extent worth mentioning. To be able to optimally prepare the conductor paste applied to the surface of the substrate for the firing or sintering operation, it can preferably be provided that the conductor paste is dried prior to the first firing phase in a drying phase at a temperature of between about 80° C. and about 200° C., preferably between 100° C. and 150° C., particularly preferably at a maximum of 130° C., preferably for a period of between about 5 min and about 20 min. Due to that drying phase the solvents present in the conductor paste are substantially completely dissipated. Known drying methods like for example infrared or hot air drying are preferred in that case. Due to the drying process and the dissipation linked thereto of the solvents in the conductor paste the conductor paste experiences a certain volume shrinkage. It is however already possible to counteract that beforehand by application of the conductor paste in a correspondingly thicker layer.

Firing or sintering of the conductor paste in the first and/or second firing phase of the proposed method can preferably be effected in a firing furnace, wherein the firing temperature prevails in the firing furnace. It will be appreciated that the drying phase and/or the cooling phase can also be effected in the firing furnace. Preferably in that case a firing furnace having a conveyor device can be used.

In dependence on the material combination used comprising substrate and conductor paste it is possible to apply a suitable firing profile. A particular variant provides that in the first firing phase the firing temperature is increased at least temporarily by between about 40° C./min and about 60° C./min. It can further be provided that in the first firing phase the firing temperature is increased to a maximum firing temperature of about 580° C., preferably about 565° C., particularly preferably about 548° C.

Heating the conductor paste to above between about 400° C. and 450° C. provides that all organic constituents like for example organic binding agents are substantially completely broken up and the inorganic constituents (for example glass powder or glass frits) soften. In addition the metal powder sintering process begins at those temperatures. The softened glass constituents of the conductor paste subsequently lead to good adhesion of the conductor paste on the substrate.

The maximum firing temperature is basically limited by the melting temperature of aluminum, which is at about 660° C. When using a silver-based conductor paste the maximum firing temperature is preferably about 565° C. while when using a copper-based conductor paste the maximum firing temperature is preferably about 548° C. Those temperatures result from the melting temperatures of possible eutectic aluminum-copper or aluminum-silver alloys which are involved in that case.

In regard to the respective maximum firing temperature glass constituents suited to a conductor paste are to be selected, whose corresponding glass transition temperature ($T_G$) or melting temperature ($T_S$) are adapted to that maximum firing temperature. The glass transition temperature or melting temperature of the glass constituent of the corresponding conductor paste should accordingly be suitably below the specified maximum firing temperature to ensure optimum adhesion of the conductor paste to the substrate. In particular glasses from the $PbO$—$B_2O_3$—$SiO_2$ system or glasses including $Bi_2O_3$ are suitable.

It has proven to be particularly advantageous if firing of the conductor paste in the second firing phase is effected for between about 5 min and about 30 min. It is possible in that way to achieve optimum adhesion of the conductor paste to the substrate. Basically, the longer the period of time in the second firing phase (at maximum firing temperature), the more densely is the conductor paste sintered and thus has better properties for further processing (for example soldering and welding). With excessively long periods in the second firing phase however the transit time in a typical firing furnace is correspondingly extended in length, which can have an adverse effect on the overall through-put.

In a further advantageous embodiment it can be provided that the predeterminable maximum firing temperature is kept substantially constant in the second firing phase.

Preferably it can also be provided that the conductor paste is exposed to a protective gas atmosphere including nitrogen in the first firing phase and/or the second firing phase. The use or an inert gas or protective gas means that it is possible to reduce or prevent oxidation of a copper contained for example in the conductor paste. That is advantageous in particular at high temperatures. A protective gas atmosphere (for example nitrogen) is advantageous for burning in copper conductor track pastes to prevent oxidation of the conductor track material (depending on the firing phase there can be a residual oxygen content of some ppm). The organic binders of such a material or of the conductor paste can be so conceived that they can be reduced in a nitrogen atmosphere. In turn a conventional air atmosphere can be advantageous for silver conductor track pastes because this does not involve any serious impairment of the conductor track surface due to oxidation. The organic binders used in that case can be oxidized by way of the oxygen in the air.

In a preferred embodiment of the invention it can be provided that in the cooling phase the firing temperature is reduced at least temporarily by between about 20° C./min and about 40° C./min, preferably by about 30° C./min.

Preferably in that case cooling is effected to ambient temperature. The slower the cooling operation, the correspondingly less are the mechanical effects of the join between the conductor paste and the substrate by virtue of different coefficients of thermal expansion of the materials used.

Due to the typical oxidation of the sintered conductor paste which occurs during the firing or sintering process due to the high temperatures prevailing in that case it is provided that the surface of the conductor paste is suitably mechanically post-treated after the cooling step in order to facilitate further processing, for example for subsequent soldering or welding processes.

According to a preferred embodiment it can be provided that the conductor paste is applied to the surface of the substrate in a thickness of between about 10 μm and about 100 μm. It will be appreciated that it is also possible to apply conductor pastes to the surface of the substrate in a thickness of less than 10 μm or conductor pastes in a thickness of more than 100 μm. It can also be provided that the proposed method is applied a plurality of time in succession to increase the overall resulting thickness of the conductor paste. Preferably the at least one conductor surface of the proposed printed circuit board, that can correspond to the sintered conductor paste, is of a thickness of between 25 μm and 125 μm, preferably between 90 μm and 110 μm.

BRIEF DESCRIPTION OF THE DRAWINGS

Further details and advantages of the present invention are described by means of the specific description hereinafter. In the drawing:

FIG. 3 shows a further proposed printed circuit board with electronic components arranged thereon, FIG. 5 shows a perspective view of a proposed power electronic module, FIG. 6 shows a side view of a power electronic module as shown in FIG. 5, FIG. 8b shows a detail view of FIG. 8a.

DETAILED DESCRIPTION

Figure 1:
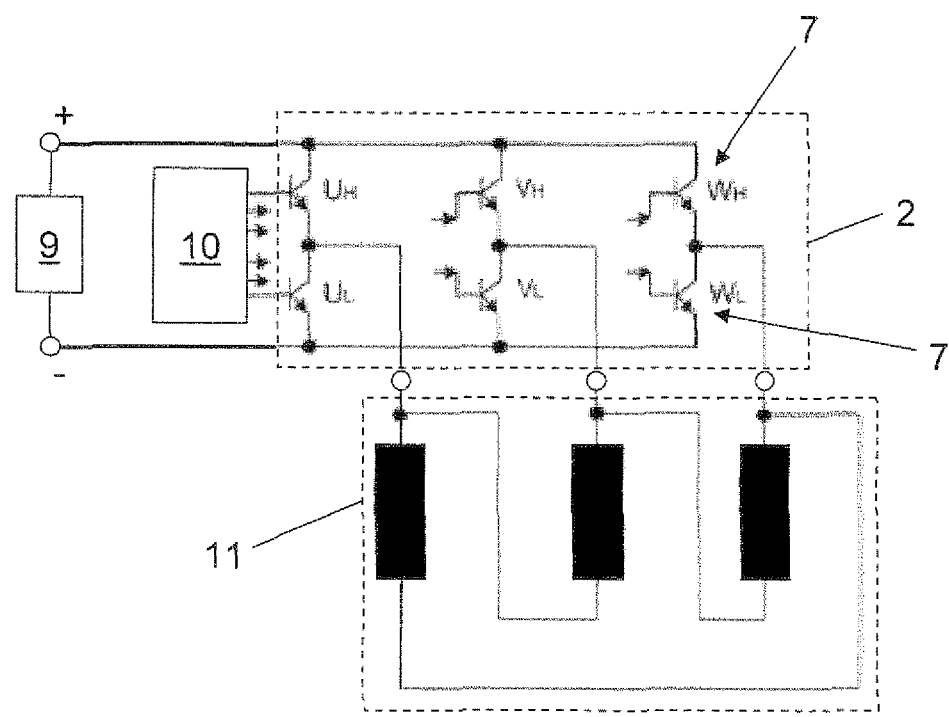
FIG. 1 shows a circuit diagram of a power electronic module in the form of an inverter.

FIG. 1 shows a block circuit diagram of a power electronic module 2 in the form of an inverter. The power electronic module 2 includes six electronic components 7 in the form of IGBTs $U_H$, $V_H$, $W^H$, $U_L$, $V_L$, $W_L$ and is connected to a dc voltage source 9, for example a battery. The gate terminals of the three highside transistors $U_H$, $V_H$, $W_H$ and the three lowside transistors $U_L$, $V_L$, $W_L$ are actuated in known manner by an electronic actuating means 10 so that the dc voltage of the dc voltage source 9 is converted by the power electronic module 2 into three phase-displaced ac voltages and fed to a three-phase motor 11. Each of the six IGBTs can additionally be connected to a corresponding free-wheeling diode. For reasons of clarity of the drawing however those free-wheeling diodes are not shown in this view.

Figure 2A:
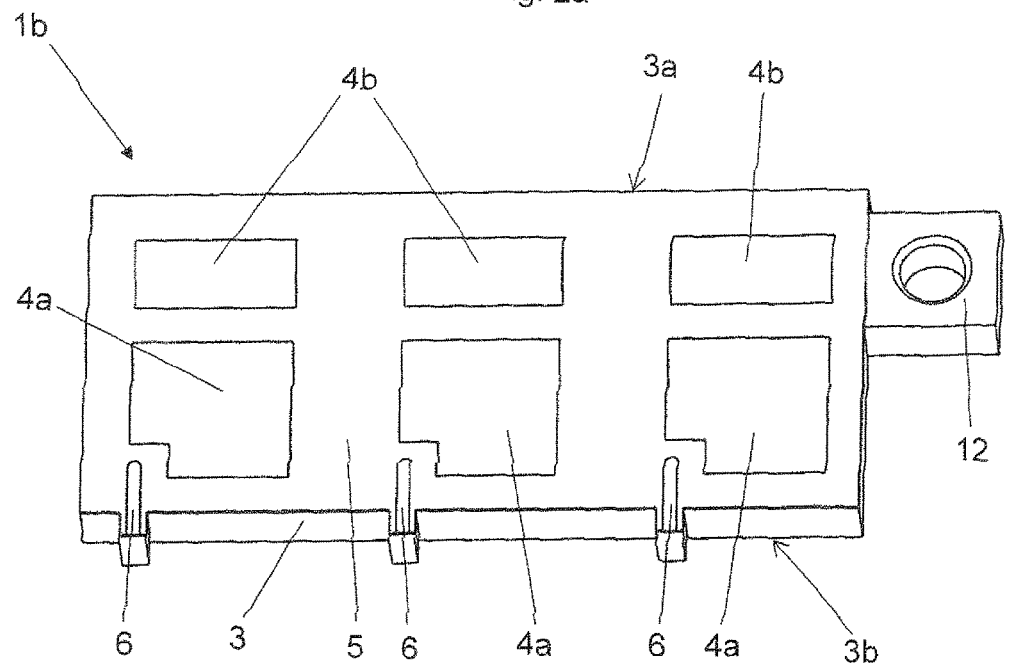
FIG. 2a shows a perspective view of a proposed printed circuit board.

FIG. 2a shows a printed circuit board 1b of a power electronic module 2 in the form of an inverter as shown in FIG. 1. The printed circuit board 1b includes an electrically conductive substrate 3 in the form of an aluminum plate, the surfaces 3a, 3b of which are substantially flat. The printed circuit board 1b can be for example the positive current bar of the inverter, that is to be connected to the positive pole of a dc voltage source 9 by means of a connecting element 12. The surface 3a of the printed circuit board 1b has three conductor surfaces 4a for IGBTs to be arranged thereon and three conductor surfaces 4b for free-wheeling diodes to be arranged thereon. The conductor surfaces 4a, 4b are surrounded or bordered by an insulator surface 5. Both conductor surfaces 4a, 4b and also insulator surface 5 can be applied to the surface 3a of the substrate 3 in the form of suitable thick-layer pastes by means of screen printing and can be fired or sintered for example in a firing furnace. To be able to supply the gate terminals of the IGBTs with suitable control signals appropriate connecting surfaces 6 are additionally arranged on the insulator surface 5.

Figure 2B:
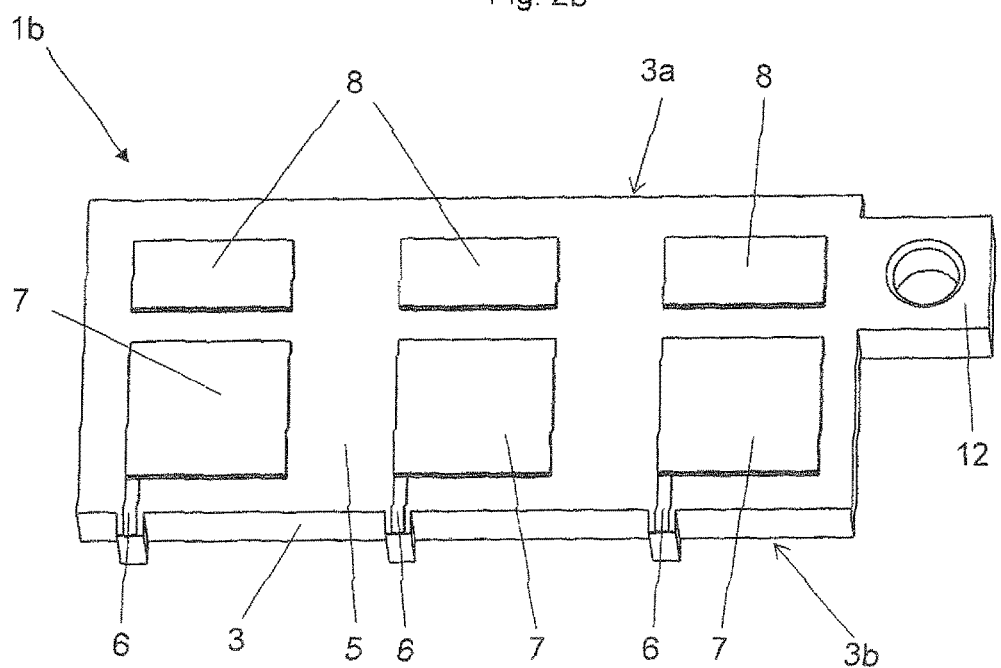
FIG. 2b shows the printed circuit board of FIG. 2a with electronic components arranged thereon.

FIG. 2b shows the printed circuit board 1b of FIG. 2a with IGBTs 7 arranged on the conductor surfaces 4a and with free-wheeling diodes 8 arranged on the conductor surfaces 4b. In this case the gate terminals of the IGBTs 7 are connected to the connecting surfaces 6.

FIG. 3 shows a further printed circuit board 1a similar to that of FIG. 2a—but without gate terminals or connecting surfaces 6—with IGBTs 7 arranged on the conductor surfaces 4a and free-wheeling diodes 8 arranged on the conductor surfaces 4b. In this case the electronic components 7, 8 are soldered to the corresponding conductor surfaces 4a, 4b for example by means of vapor phase soldering.

Figure 4:
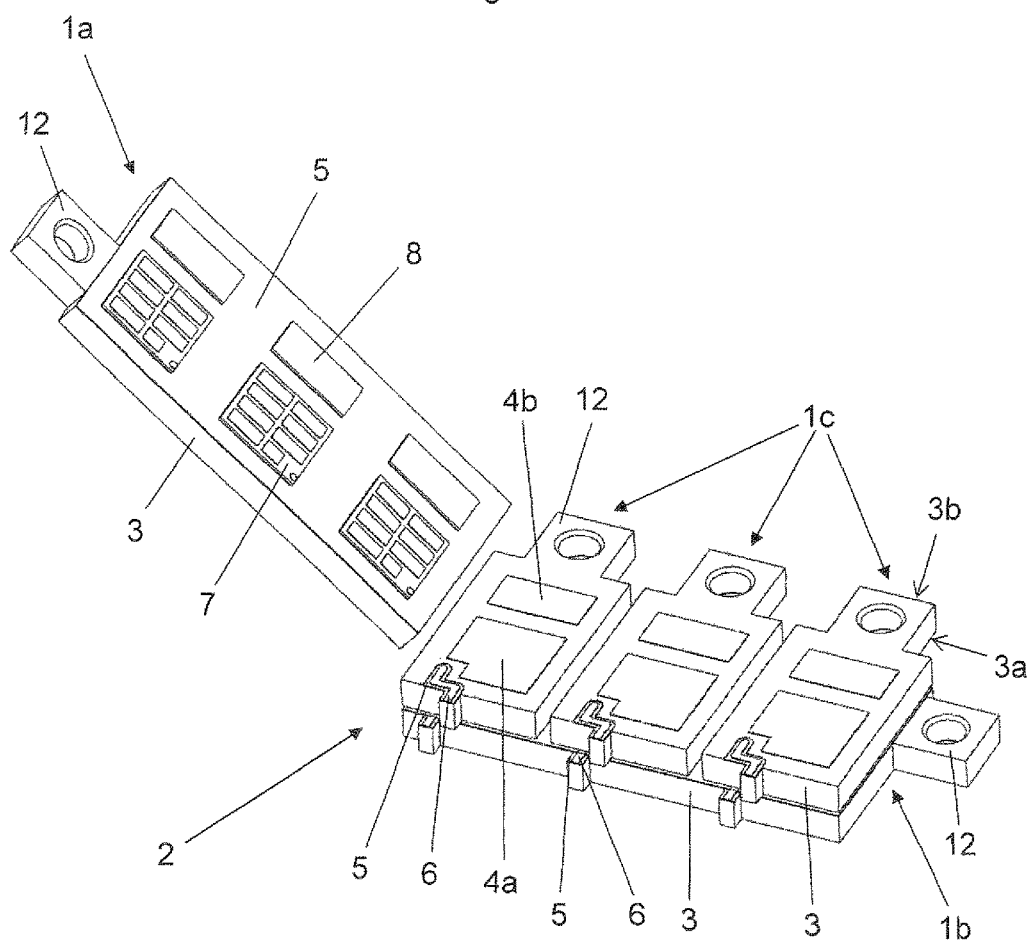
FIG. 4 shows an embodiment of a proposed power electronic module during assembly.

FIG. 4 shows an embodiment of a power electronic module 2 as shown in FIG. 1, wherein the power electronic module 2 includes a first printed circuit board 1a, a second printed circuit board 1b and three third printed circuit boards 1c. In this case the first printed circuit board 1a corresponds to the printed circuit board 1a shown in FIG. 3 and the second printed circuit board 1b corresponds to the printed circuit board 1b shown in FIG. 2a. The first printed circuit board 1a can be connected for example to the negative pole of a dc voltage source 9 by means of the connecting element 12 of the substrate 3 of the first printed circuit board 1a, whereby the substrate 3 of the first printed circuit board 1a is in the form of a negative current bar. The second printed circuit board 1b can be connected for example to the positive pole of a dc voltage source 9 by means of the connecting element 12 of its substrate 3, whereby the substrate 3 of the second printed circuit board 1b is in the form of a positive current bar.

The three third printed circuit boards 1c respectively include an electrically conductive substrate 3 in the form of an aluminum plate, the surfaces 3a, 3b of which are substantially flat. A respective electrically conductive conductor surface 4a for an IGBT to be connected thereto and an electrically conductive conductor surface 4b for a free-wheeling diode to be connected thereto are arranged at each first surface 3a of the substrate 3 of a third printed circuit board 1c. Arranged on each of the second surfaces 3b of a substrate 3 of a third printed circuit board 1c, in addition to the electrically conductive conductor surfaces 4a, 4b, corresponding to the respective first surface 3a, is an insulator surface 5, on which an electrically conductive connecting surface 6 is arranged for contacting a gate electrode of an IGBT. Each substrate 3 of the three third printed circuit boards 1c has a connecting element 12, with which each of the three third printed circuit boards 1c is to be connected to a phase of a three-phase motor 11.

As shown in FIG. 4, to assemble the power electronic module 2, the printed circuit boards 1a, 1b, 1c are stacked vertically one above the other in such a way that the three third printed circuit boards 1c are arranged in mutually juxtaposed relationship between the first printed circuit board 1a and the second printed circuit board 1b. Disposed between the first printed circuit board 1a and the three third printed circuit boards 1c are three IGBTs 7 and three free-wheeling diodes 8 which can be soldered to the respective conductor surfaces 4a, 4b of the printed circuit boards 1a, 1c. Likewise in turn disposed between the three third printed circuit boards 1c and the second printed circuit board 1b are three IGBTs 7 and three free-wheeling diodes 8 which can be soldered to the corresponding conductor surfaces 4a, 4b of the first surfaces 3a of the third printed circuit boards 1c and the first surface 3a of the second printed circuit board 1b. The gate terminals of the three IGBTs 7 between the first printed circuit board 1a and the three third printed circuit boards 1c can be contacted by way of the connecting surfaces 6 on the second surfaces 3b of the third printed circuit boards 1c and the gate terminals of the IGBTs 7 between the three third printed circuit boards 1c and the second printed circuit board 1b can be contacted by way of the connecting surfaces 6 of the first surface 3a of the second printed circuit board 1b.

FIG. 5 shows a finished assembled power electronic module 2 as shown in FIG. 4 with the difference that an insulator surface 5 in the form of a dielectric layer applied by a screen printing process is respectively arranged on both surfaces 3a, 3b of the three third printed circuit boards 1c, wherein the respective insulator surface 5 of a surface 3a, 3b surrounds the respective conductor surfaces 4a, 4b. Here in particular the vertical stacking of the printed circuit boards 1a, 1b, 1c and the compact structure of the power electronic module 2 achieved in that way is also apparent.

FIG. 6 shows a side view of the power electronic module 2 of FIG. 5. The connecting elements 12 of the substrates 3 of the printed circuit boards 1a, 1b, 1c form in this case the connecting points to further components (see FIG. 1). In this arrangement the connecting element 12 of the first printed circuit board 1a can be connected to the negative pole of the dc voltage source 9 and the connecting element 12 of the second printed circuit board 1b can be connected to the positive pole thereof. The connecting elements 12 of the three third printed circuit boards 1c can be connected to the corresponding phase connections of a three-phase motor 11.

Figure 7A:
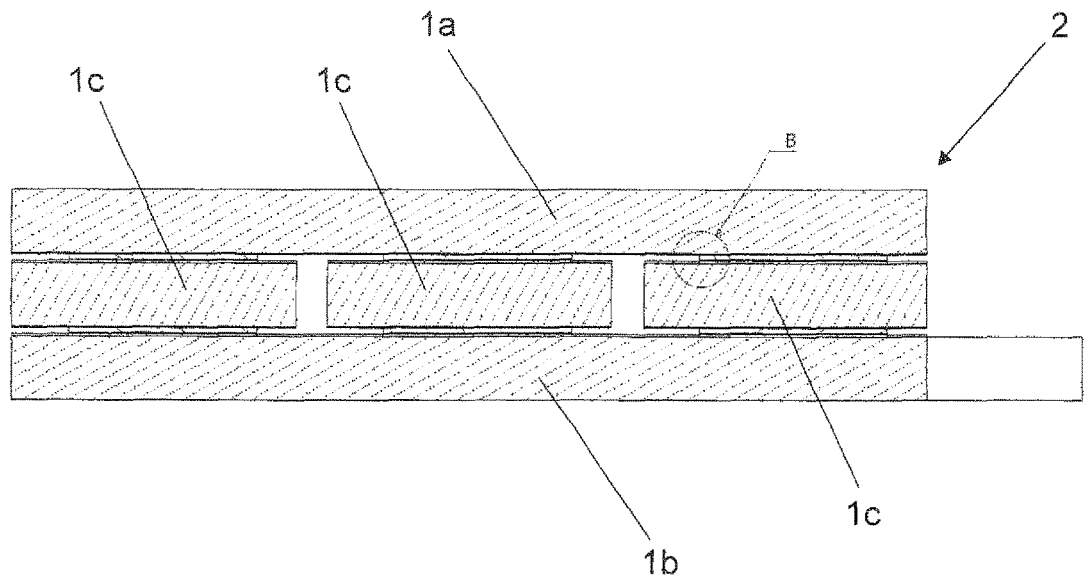
FIG. 7a shows a sectional view along section line I-I in FIG. 5.
Figure 7B:
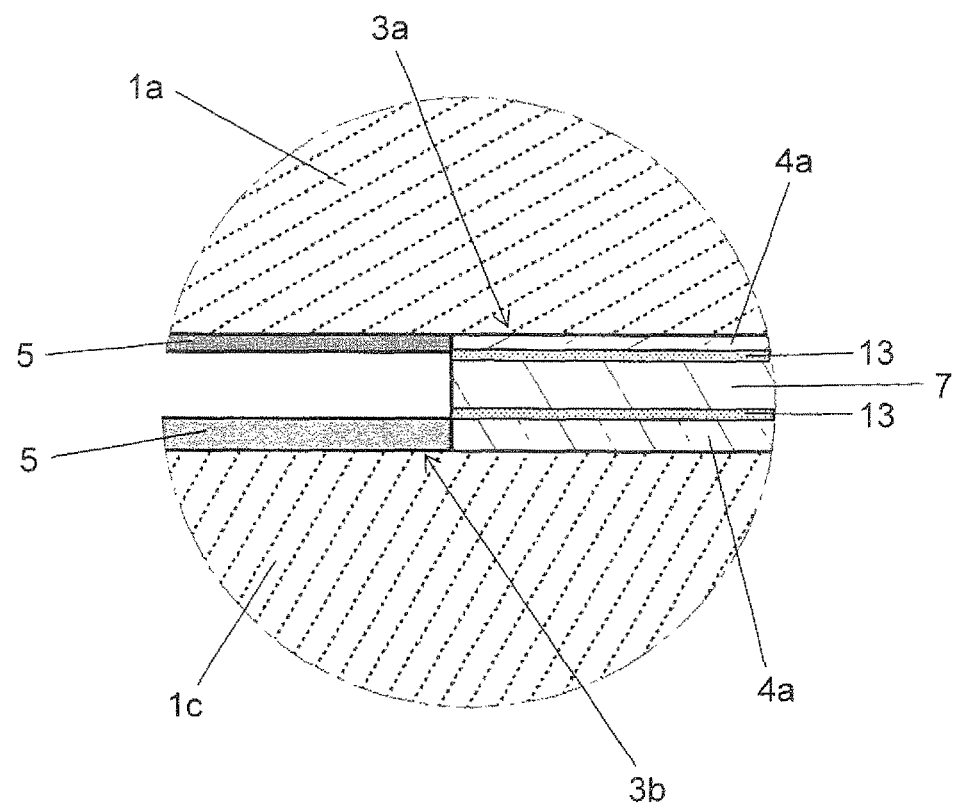
FIG. 7b shows a detail view of FIG. 7a, FIG. 8a shows a sectional view along section line II-II in FIG. 5.

FIG. 7a shows a sectional view of the power electronic module 2 of FIG. 5 along section line I-I and FIG. 7b shows the region B marked with a circle in FIG. 7a on an enlarged scale. The enlarged view in FIG. 7b shows an IGBT 7 arranged between the first printed circuit board 1a and one of the three third printed circuit boards 1c of the power electronic module 2. In this case the IGBT 7 is soldered both on the conductor surface 4a at the surface 3a of the first printed circuit board 1a and also on the conductor surface 4a at the surface 3b of the third printed circuit board 1c, for example by means of vapor phase soldering. The solder used in that case is respectively indicated by reference 13. The conductor surfaces 4a and also the conductor surfaces 4b (not visible here) on the surface 3a of the first printed circuit board 1a and on the surface 3b of the third printed circuit board 1c are surrounded by a dielectric insulator surface 5.

Figure 8A:
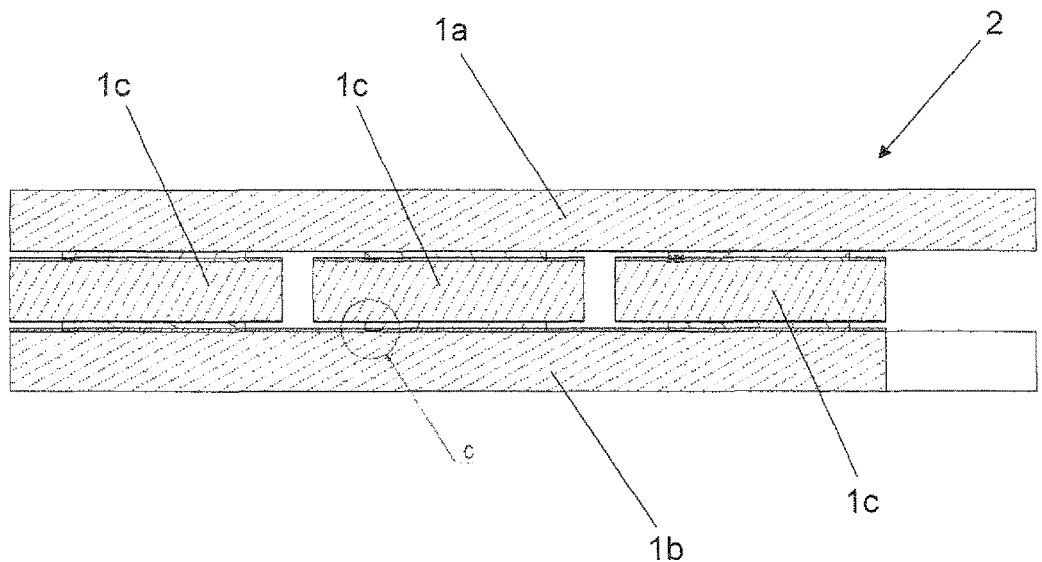
Figure 8B:
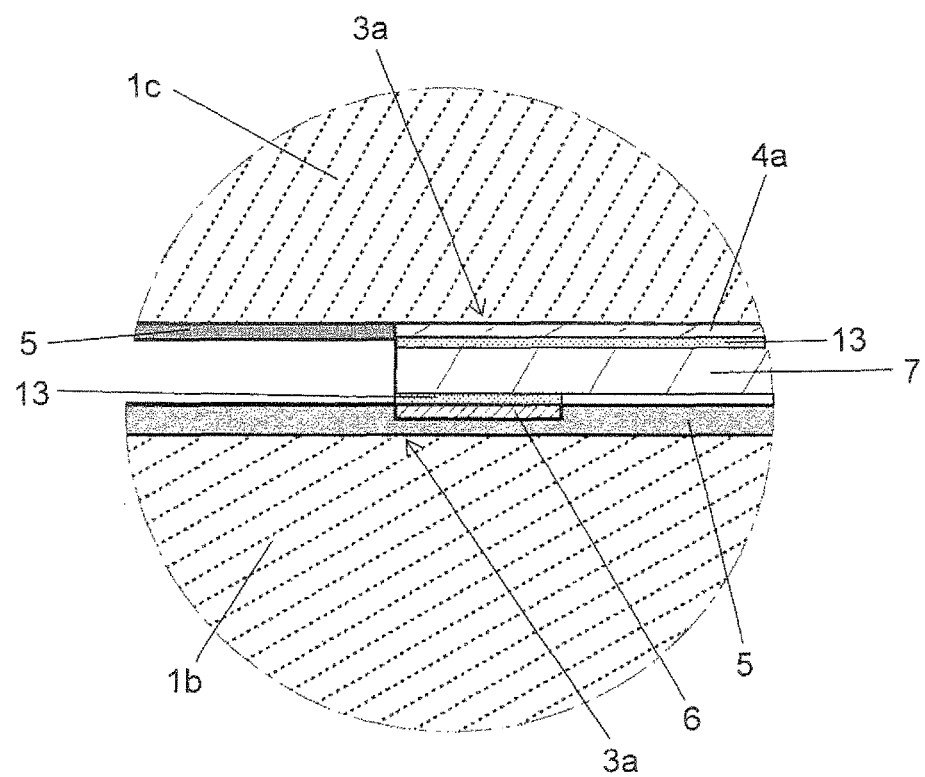

FIG. 8a shows a sectional view of the power electronic module 2 of FIG. 5 along section line II-II and FIG. 8b shows the region C marked with a circle in FIG. 8a on an enlarged scale. In comparison with the detail view in FIG. 7b it is possible to see in the enlarged view of FIG. 8b an IGBT 7 arranged between the second printed circuit board 1b and one of the three third printed circuit boards 1c of the power electronic module 2. The conductor surfaces 4a, 4b on the surface 3a of the second printed circuit board 1b and on the surface 3a of the third printed circuit board 1c are surrounded by a dielectric insulator surface 5. The illustrated section along section line II-II in FIG. 5 is in the region of the gate terminal of the IGBT 7. To be able to electrically actuate the gate of the IGBT 7 a connecting surface 6 in the form of an electrically conductive layer is arranged on the insulator surface 5 on the surface 3a of the second printed circuit board 1b. Once again reference 13 denotes the respective solder used for soldering the IGBT 7 to the conductor surface 4a of the third printed circuit board 1c and to the connecting surface 6 of the second printed circuit board 1b.

In the case of a proposed power electronic module 2 with proposed printed circuit boards 1a, 1b, 1c electronic components 7, 8 can be soldered directly on to the substrates 3 of the printed circuit boards 1a, 1b, 1c by the provision of solderable electrically conductive conductor surfaces 4a, 4b. As a result it is possible to dispense with other usual connecting procedures like for example wire bonding. By virtue of the additional provision of an insulator surface 5 it is possible for the printed circuit boards 1a, 1b, 1c to be arranged in a very compact fashion, for example to be stacked vertically, without in that respect forfeiting dielectric strength. In the case of a stacked structure therefore the spacing between two current- or voltage-carrying substrates 3 of printed circuit boards 1a, 1b, 1c can be reduced to the thickness of the electronic components 7, 8 (for example 250 µm of a conventional IGBT 7) and the thickness of the conductor surfaces 4a, 4b (for example 100 µm). In the case of a power electronic module 2 in the form of an inverter a reduced spacing between the highside transistors and the lowside transistors also makes it possible to achieve reduced inductance of the power electronic module 2 and thus to increase the efficiency of the power electronic module 2.

In the production of a power electronic module it can be provided that the conductor surfaces 4a, 4b and the connecting surface 6 of a printed circuit board 1a, 1b, 1c are respectively jointly fired or sintered.

In a particularly preferred embodiment it can be provided that the whole, preferably stacked, power electronic module 2 is finished in one working step insofar as the components 7, 8 (see FIG. 4) arranged between the respective printed circuit boards 1a, 1b, 1c are soldered in one working step to the respective conductor surfaces 4a, 4b and connecting surfaces 6 (for example by vapor phase soldering). It will be appreciated that it can also be provided that the operation of assembling the printed circuit boards 1a, 1b, 1c is performed in a plurality of steps. For example the electronic components 7, 8 can be respectively soldered to the first printed circuit board 1a and the second printed circuit board 1b and in a further step the electronic components 7, 8 can be soldered to the corresponding conductor surfaces 4a, 4b and connecting surfaces 6 of the third printed circuit boards 1c. In that case the insulator surfaces 5 of the printed circuit boards 1a, 1b, 1c can also act as solder stop masks which hold the electronic components 7, 8 in the desired positions during a soldering operation.

A solder paste to be arranged on the conductor surfaces 4a, 4b can generally also be used to better orient the substrates 3 of the printed circuit boards 1a, 1b, 1c with each other, insofar as for example layers of differing thickness of solder pastes are applied to the conductor surfaces 4a, 4b. In general it is also possible to use shaped solder pieces instead of solder paste.

Solders with different melting points can also be used for soldering. Thus for example an SnAgCu-solder with a liquidus temperature of about 220° C. and a high-lead solder with a liquidus temperature of about 300° C. can be used. As a result for example firstly the electronic components can be soldered with their first sides on the conductor surfaces of a substrate with the high-lead solder and fixed there and in a further step the electronic components can be soldered with their second sides using the SnAgCu solder on the conductor surfaces of a further substrate. Accordingly therefore the components can be reliably held in position.

With the proposed printed circuit board it is generally possible to provide a substrate which in addition to a heat dissipation function also takes over the function of an electrical conductor. By applying electrically conductive conductor surfaces and dielectric insulator surfaces to the substrate of a proposed printed circuit board on the one hand electronic components can be easily soldered to the substrate and thus electrically contacted while on the other hand it is possible to achieve compact structural configurations for power electronic modules, for example by vertical stacking. Spacings of voltage-carrying parts can be reduced and thus the inductance of a power electronic module can be reduced by the insulator surfaces. In addition, direct, double-sided cooling of a power electronic module can also be achieved by the use of aluminum as the material for the substrates, and that permits higher current densities. By virtue of the provision of solder joins, it is possible to dispense with other joining procedures like wire bonding, whereby the reliability of component connections can be increased. When using thick-layer procedures for the production of conductor surfaces on the substrate of a proposed printed circuit board it is also possible for the thermal resistance between an electronic component disposed on the substrate and the substrate acting as a cooling body to be reduced by the direct assembly of components on the substrate, which is made possible in that way. Due to the high porosity of a copper conductor paste which is sintered at comparatively low temperatures it is also possible to reduce the mechanical stress in a solder layer between a conductor surface and an electronic component arranged thereon. That leads in particular to a higher temperature cycle resistance and an increased service life.

The invention claimed is:
1. A high-current multi-phase power bridge comprising:
three printed circuit boards each comprising:
an electrically conductive substrate completely comprising aluminum and/or an aluminum alloy, at least one electrically conductive layer arranged on and directly electrically contacting the electrically conductive substrate, the electrically conductive layer having been applied by a screen printing process, and the electrically conductive substrate including a connecting element to connect the printed circuit board to a power source or power sink;
a first plurality of conductor surfaces arranged on a first surface of the electrically conductive substrate;
a second plurality of conductor surfaces and an insulator surface arranged on a second surface of the electrically conductive substrate; and a connecting surface arranged on the insulator surface;
three insulated-gate bipolar transistors (IGBTs) and three free-wheeling diodes soldered on at least one surface of a first additional printed circuit board, and
three insulated-gate bipolar transistors (IGBTs) and three free-wheeling diodes soldered on at least one surface of a second additional printed circuit board.

2. A high-current multi-phase power bridge comprising:
three printed circuit boards each comprising:
  an electrically conductive substrate at least partially comprising aluminum and/or an aluminum alloy, at least one electrically conductive layer arranged on and directly electrically contacting the electrically conductive substrate, the electrically conductive substrate including a connecting element to connect the printed circuit board to a power source or power sink;
  a first plurality of conductor surfaces arranged on a first surface of the electrically conductive substrate;
  a second plurality of conductor surfaces and an insulator surface arranged on a second surface of the electrically conductive substrate; and
  a connecting surface arranged on the insulator surface;
three transistors and three free-wheeling diodes mounted on a surface of a first additional printed circuit board; and
three more transistors and three more free-wheeling diodes mounted on a surface of a second additional printed circuit board.

* * * * *